United States Patent
Agrawal et al.

(10) Patent No.: US 11,887,988 B2
(45) Date of Patent: Jan. 30, 2024

(54) THIN FILM TRANSISTOR STRUCTURES WITH REGROWN SOURCE AND DRAIN

(71) Applicant: Intel Corporation, Santa Clara, CA (US)

(72) Inventors: Ashish Agrawal, Hillsboro, OR (US); Jack Kavalieros, Portland, OR (US); Anand Murthy, Portland, OR (US); Gilbert Dewey, Hillsboro, OR (US); Matthew Metz, Portland, OR (US); Willy Rachmady, Beaverton, OR (US); Cheng-Ying Huang, Hillsboro, OR (US); Cory Bomberger, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 896 days.

(21) Appl. No.: 16/529,643

(22) Filed: Aug. 1, 2019

(65) Prior Publication Data

US 2021/0036023 A1    Feb. 4, 2021

(51) Int. Cl.
*H01L 27/12* (2006.01)
*H01L 29/08* (2006.01)
*H01L 29/66* (2006.01)
*H01L 29/10* (2006.01)
*H01L 29/417* (2006.01)

(52) U.S. Cl.
CPC ...... *H01L 27/1207* (2013.01); *H01L 29/0847* (2013.01); *H01L 29/1033* (2013.01); *H01L 29/41733* (2013.01); *H01L 29/66742* (2013.01)

(58) Field of Classification Search
CPC ............. H01L 27/1207; H01L 29/0847; H01L 29/1033; H01L 29/41733; H01L 29/66742; H01L 29/78603; H01L 29/78648
USPC .......................................................... 257/69
See application file for complete search history.

(56) References Cited

U.S. PATENT DOCUMENTS

| 6,646,287 | B1 * | 11/2003 | Ono ..................... H01L 29/4908 257/E27.111 |
| 9,368,512 | B1 | 6/2016 | Cheng et al. |
| 9,685,436 | B2 | 6/2017 | Morrow et al. |
| 9,711,501 | B1 | 7/2017 | Basker et al. |
| 2004/0007724 | A1 | 1/2004 | Murthy et al. |
| 2004/0065882 | A1 * | 4/2004 | Yamazaki ........... H01L 27/1255 257/E27.113 |

(Continued)

FOREIGN PATENT DOCUMENTS

CN            105448727 A   *  3/2016

*Primary Examiner* — Mohammad M Hoque
(74) *Attorney, Agent, or Firm* — Essential Patents Group, LLP

(57) ABSTRACT

Thin film transistor structures may include a regrown source or drain material between a channel material and source or drain contact metallization. The source or drain material may be selectively deposited at low temperatures to backfill recesses formed in the channel material. Electrically active dopant impurities may be introduced in-situ during deposition of the source or drain material. The source or drain material may overlap a portion of a gate electrode undercut by the recesses. With channel material of a first composition and source or drain material of a second composition, thin film transistor structures may display low external resistance and high channel mobility.

17 Claims, 10 Drawing Sheets

(56) References Cited

U.S. PATENT DOCUMENTS

| | | | |
|---|---|---|---|
| 2006/0186398 A1* | 8/2006 | Hsieh | H01L 51/0545 |
| | | | 257/40 |
| 2010/0163926 A1* | 7/2010 | Hudait | H01L 29/785 |
| | | | 257/E29.081 |
| 2013/0154016 A1* | 6/2013 | Glass | H01L 29/785 |
| | | | 438/285 |
| 2013/0187198 A1 | 7/2013 | Camillo-Castillo et al. | |
| 2013/0270512 A1 | 10/2013 | Radosavljevic et al. | |
| 2015/0021771 A1 | 1/2015 | Lin | |
| 2016/0322503 A1 | 11/2016 | Tezuka et al. | |
| 2018/0090582 A1 | 3/2018 | Adusumilli et al. | |
| 2018/0130785 A1* | 5/2018 | Wang | H01L 27/092 |
| 2018/0145135 A1* | 5/2018 | Zhang | H01L 29/66545 |
| 2018/0308850 A1 | 10/2018 | Kang et al. | |
| 2018/0331232 A1 | 11/2018 | Frougier et al. | |
| 2019/0035889 A1 | 1/2019 | Mohapatra et al. | |
| 2019/0348540 A1 | 11/2019 | Pillarisetty et al. | |
| 2020/0126987 A1 | 4/2020 | Rubin et al. | |
| 2020/0135930 A1 | 4/2020 | Passlack et al. | |
| 2021/0036023 A1 | 2/2021 | Agrawal et al. | |

\* cited by examiner

THIN FILM TRANSISTOR STRUCTURES WITH REGROWN SOURCE AND DRAIN

BACKGROUND

A thin-film transistor (TFT) is a class of field-effect transistors (FETs) in which the channel material is a deposited thin film rather than a surface layer of a monocrystalline substrate material. Group IV materials (e.g., Si, Ge) may be employed in TFTs, but oxide semiconductors are also promising channel materials for TFTs.

Demand for integrated circuits (ICs) in portable electronic applications has motivated greater levels of semiconductor device integration. If a thin film semiconductor material can be deposited at relatively low temperatures (e.g., below 450° C.), one or more transistor device levels may be integrated monolithically with one or more other device levels that may include other TFTs or even other FETs that have been fabricated within a bulk semiconductor layer. However, many thin film transistors display high on-state resistance, limiting the performance of circuitry employing such devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
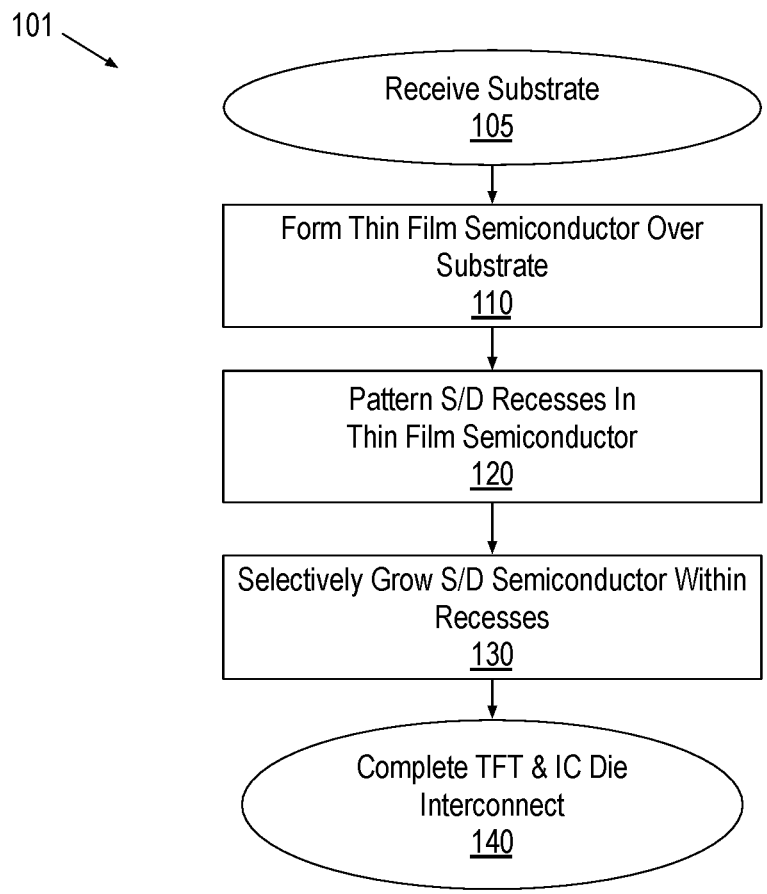
FIG. 1 is a flow diagram illustrating methods of fabricating thin film transistor structures, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are thin film transistor (TFT) structures employing regrown, impurity-doped source or drain material, and methods of fabricating TFT structures including such source or drain material. Source and drain material having low electrical resistance can reduce parasitic external resistance ($R_{ext}$) associated with a TFT structure. In front-end CMOS technology, source/drain structures having low electrical resistance can be fabricated by a high temperature epitaxial growth (e.g., >800° C.), or ion implantation followed by a high temperature thermal activation. However, these techniques are generally not suitable for TFTs that are integrated in the back-end of line (BEOL) of an IC fabrication process because such high temperature processing in the back-end can detrimentally impact the performance and reliability of any previously fabricated transistors (e.g., those in FEOL circuitry or at a lower level of BEOL circuitry).

In accordance with some TFT embodiments described herein, low-temperature (e.g., <450° C.) processes are employed to deposit an in-situ doped source or drain material having a composition distinct from that of the channel material. The concentration of electrically active dopants within such source and drain material may be much higher than within a channel material. With an impurity-doped source or drain material, impurities within the channel material may minimized. As such, the TFT structures including impurity-doped source or drain material as described herein may have significantly higher channel mobility than a TFT structure that might include impurity dopants throughout the channel material. The TFT structures including selectively doped source or drain material in accordance with embodiments herein may also display significantly lower $R_{ext}$ than a TFT structure that otherwise relies on the formation of Schottky junction between contact metallization and a channel material (e.g., undoped or lightly doped).

For some exemplary embodiments, the composition of the source and/or drain material has the advantage of a low energy of substitution of dopants into the microstructure of the source and/or drain material, resulting in superior dopant activation at low temperatures. For example, where a source or drain material is crystalline (e.g., polycrystalline), lattice sites occupied by majority constituents may be more readily substituted by certain impurity dopants, rendering a greater fraction of the chemical impurities electrically active.

In some exemplary PMOS embodiments, p-type source and drain material may advantageously include at least one of Ge or Sn as majority constituents, into which certain p-type dopants, such as, but not limited to, B or Ga, may be readily substituted at low temperatures. For some such embodiments, the channel material does not include either Ge or Sn, or if it does, at least not to the same extent as the source or drain material. For example, a PMOS TFT with a p-type source and drain material including at least one of Ge or Sn impurity doped with B or Ga, may have a channel material that comprises predominantly Group IV lattice constituents (e.g., Si and/or Ge), predominantly Group III and Group IV lattice constituents (e.g., GaSb, InGaSb alloys), or a metal oxide comprising predominantly oxygen and one or more metals (e.g., $CuO_x$).

In some exemplary NMOS embodiments, n-type source and drain material may advantageously include Group III elements and Group IV elements as majority constituents, into which certain n-type dopants, such as, but not limited to, Si, may be readily substituted at low temperatures. For some such embodiments, the channel material does not include a Group III-V alloy, or if it does, the alloy may not be the same as the source or drain material. For example, a NMOS TFT with a n-type source and drain material including at least one of In or As impurity doped with Si, may have a channel material that comprises predominantly Group IV lattice constituents (e.g., Si and/or Ge), predominantly Group III and Group IV lattice constituents (e.g., GaSb, InGaSb alloys), or a metal oxide comprising predominantly oxygen and one or more metals (e.g., $InO_x$).

In some further embodiments, TFT structures comprise source and/or drain material that overlaps a portion of a gate electrode. Overlap of the gate electrode and source/drain material may ensure there is no ungated resistive material between the transistor channel and contact metallization that could increase external resistance. Gate electrode overlap may be achieved through one or more techniques employed to selectively form source and/or drain material, for example by replacing and/or augmenting some portion of a thin film material that is employed as the transistor channel.

FIG. 1 is a flow diagram illustrating fabrication methods 101, in accordance with some exemplary embodiments. Methods 101 begin at block 105 where a substrate is received. The substrate may advantageously include a monocrystalline semiconductor layer, such as a silicon layer, upon which front-end-of-line (FEOL) FETs may be fabricated, for example upstream of methods 101. The substrate received may include FEOL FETs of any architecture that have been fabricated using any technique, and that are interconnected with one or more metallization levels to form FEOL circuitry. In some embodiments, the FEOL FETs include both n-type and p-type FETs interconnected into a CMOS FEOL circuit. Alternatively, the substrate received at block 105 may include back-end-of-line (BEOL) transistor layers over which an additional BEOL transistor layer may be formed.

At block 110, a first thin film semiconductor material is formed over the substrate. The material deposited at block 110 may have any composition that is suitable for a channel region of a transistor, and is therefore referred to herein as "channel material." The channel material may be deposited by any technique suitable for a desired material composition and microstructure. For example, the channel material may be deposited by physical vapor deposition (PVD), chemical vapor deposition (CVD), atomic layer deposition (ALD), or molecular beam epitaxy (MBE). As noted above, processing temperatures are not to exceed 450° C., with deposition of the channel material at block 110 advantageously below 400° C., and may be 350° C., or less. The channel material may be deposited to any thickness. In some exemplary embodiments, channel material is deposited to less than 50 nm, advantageously less than 20 nm, and may be deposited to 10 nm, or less (e.g., 5-8 nm).

The material deposited at block 110 has semiconducting properties suitable for gating conduction according to the field effect. In some embodiments, the channel material deposited at block 110 comprises predominantly silicon (e.g., substantially pure Si), predominantly germanium (e.g., substantially pure Ge), or an alloy comprising a Group IV majority constituent (e.g., SiGe alloys, GeSn alloys). In other embodiments, the channel material deposited at block 110 is a Group III-N material comprising predominantly nitrogen and a Group III majority constituent (e.g., GaN, InN, InGaN). In other embodiments, the channel material deposited at block 110 is a Group III-V material comprising a Group III majority constituent and a Group IV majority constituent (e.g., InGaAs, GaAs, GaSb, InGaSb). In other embodiments, the channel material deposited at block 110 is an oxide semiconductor. An oxide semiconductor can have good transistor channel characteristics, for example offering high carrier mobility and a tunable material band gap and resistivity. Oxide semiconductor materials primarily include one or more metals, and oxygen. The metal(s) may be from the transition metals (e.g., IUPAC group 4-10) or post-transition metals (e.g., IUPAC groups 11-15). The metal oxide compounds may be suboxides ($A_2O$), monoxides (AO), binary oxides ($AO_2$), ternary oxides ($ABO_3$), and mixtures thereof. In advantageous embodiments, the channel materials deposited at block 110 includes oxygen and at least one of Mg, Cu, Zn, Sn, Ti, In, or Ga.

In some specific embodiments, the channel material deposited at block 110 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, the oxide semiconductor deposited at block 110 comprises a zinc oxide ($ZnO_x$), such as Zn(II) oxide, or ZnO. In other embodiments, the zinc oxide is zinc peroxide ($ZnO_2$) or a mixture of ZnO and $ZnO_2$, where x may range between 1 and 2. In some embodiments, the oxide semiconductor material deposited at block 110 comprises $ZnO_x$ doped with In and Ga, for example. In some such embodiments, the oxide semiconductor deposited at block 110 is $InGaO_3(ZnO)_5$, often referred to as IGZO. In some other embodiments, the oxide semiconductor deposited at block 110 comprises titanium oxide ($TiO_x$). Exemplary oxide semiconductors that may have suitable p-type conductivity include copper oxide ($CuO_x$). In some $CuO_x$ embodiments, the oxide semiconductor deposited at block 110 is Cu(I) oxide, or $Cu_2O$. In other embodiments, oxide semiconductor deposited at block 110 is Cu(II) oxide (CuO) or a mixture of CuO and $Cu_2O$, where x may range between 0.5 and 1.

Channel material deposited at block 110 may be intentionally doped (e.g., p-type or n-type), or not (i.e., intrinsic). Compared to intrinsic material that is not intentionally doped, n-type and p-type channel material may have a higher concentration of impurities. Electrically active dopants, such as elements introducing excess electrons or electron vacancies, oxygen vacancies may be introduced as a means of tuning the semiconducting properties of the channel material deposited at block 110. Dopant levels in channel material deposited at block 110 may be selected to arrive at optimal threshold voltage associated with gating the channel region of a transistor, for example.

Channel material deposited at block 110 may have any morphology or microstructure. In some embodiments, channel material deposited at block 110 has crystallinity. The channel material is substantially monocrystalline, or it may be polycrystalline (e.g., microcrystalline or nanocrystalline). If polycrystalline, the crystallinity may further comprise a texture, or not. In still other embodiments, the channel material lacks crystallinity (i.e., having no discernable long-rang order) and is substantially amorphous.

Methods 101 continue at block 120 where the channel material deposited at block 110 is patterned to form a surface upon which source and/or drain material will be regrown. Block 120 is therefore to, at least in part, define the extent of a transistor's channel region. In some embodiments, one or more recesses are etched into the material that was deposited at block 110. These recesses may extend a certain lateral distance as well as a certain depth into the channel material. In some embodiments, a pair of recesses, one to contain a source material, and another to contain a drain material, are etched into the channel material at block 120. Recesses etched at block 120 may have any depth less than the thickness of the channel material, or the recesses may be etched completely through the thickness of the channel material. Recesses etched at block 120 may be masked by any suitable sacrificial or permanent feature. In some embodiments, recesses etched at block 120 are masked by a gate stack that is retained as a permanent feature of a transistor structure. In some other embodiments, recesses etched at block 120 are masked by a sacrificial structure, such as, but not limited to a sacrificial gate mandrel. In some advantageous embodiments, a recess formed at block 120 undercuts the transistor gate stack or gate mandrel to open up source and/or drain region in preparation for the formation of source and/or drain material. The undercut may advantageously define a lateral width of the channel material to be less than a lateral width of the gate stack or gate mandrel.

Following a patterning of the channel material, at block 130 another material having superior conductivity is deposited onto one or more exposed surface of the channel material. The material deposited at block 130 may have any composition distinct from that of the channel material, and is therefore referred to herein as "source material" and/or "drain material." The source or drain material is to be formed adjacent to the channel material, for example with the channel material separating source material from drain material.

Source or drain material may be deposited by any technique suitable for a desired material composition and microstructure. Source or drain material may be deposited, for example, by PVD, CVD, ALD, or MBE. As noted above, processing temperatures are not to exceed 450° C., with deposition of the source or drain material at block 130 advantageously be performed so that the IC structure does not exceed 400° C. The source or drain material may be deposited to any thickness. In some embodiments, where one or more recesses are formed at block 120, the recesses are at least partially backfilled with source or drain material. In further embodiments, the recesses are completely backfilled, and may be overfilled to form a raised source or drain regions that have a greater material thickness than that of the channel material separating them. In some exemplary, source and/or drain material is deposited to a thickness of at least 5 nm, advantageously at least 10 nm, and potentially to a thickness of 20 nm, or more. Where patterning of the channel material undercuts a portion of the gate stack, the source and/or drain material is deposited at block 130 so as to backfill the gate stack undercut or to otherwise overlap the gate stack (i.e., avoiding an underlap condition where the channel material extends beyond an edge of the gate stack).

In some embodiments, the source and/or drain material deposited at block 130 has a higher impurity dopant concentration than that of the channel material. In some exemplary embodiments, the source and drain material has an impurity dopant concentration of at least $5\times10^{20}$ atoms/cm$^3$, advantageously at least $8\times10^{20}$ atoms/cm$^3$, and can be $9\times10^{20}$ atoms/cm$^3$, or more. Although some of these impurity dopants may be electrically inactive, in advantageous embodiments the concentration of electrically active impurities is at least $3\times10^{20}$ atoms/cm$^3$.

In accordance with some embodiments, the impurity dopant is introduced at block 130 in-situ with deposition of the majority constituents. Such in-situ doping may achieve, for a given processing temperature, a greater substitution of the majority constituents by the impurity dopants than possible with an ex-situ source/drain doping technique, such as implantation and anneal of the dopant. The impurity dopant, as well as the majority lattice constituents of the source or drain material deposited at block 130, may depend on the desired source/drain conductivity type. For example, n-type material compositions suitable for a NMOS TFT may have a high density of states near the valence band of the material while p-type material compositions suitable for a PMOS TFT may have high density of states near the conduction band of the material. The density of states achieved within the source or drain material may vary with the activation energy of an impurity dopant, which can further vary on both the impurity dopant and on the majority constituents of a source or drain material. The lower the activation energy, the lower the temperature at which a source or drain material having low resistance may be formed at block 130.

In some embodiments, the source and/or drain material composition differs from the channel material composition by only a greater impurity dopant concentration. Patterning of the channel material and deposition of the source and/or drain material is then for the sake of selectively increasing the dopant concentration within localized source and drain regions of a TFT. For such embodiments, a homojunction is formed between the channel material and the source and/or drain material. In some examples where channel material comprises predominantly silicon (e.g., substantially pure Si), or predominantly germanium (e.g., substantially pure Ge), a source and/or drain material deposited at block 130 also comprises predominantly silicon, or predominantly germanium, respectively. However, the source and/or drain material further includes a significantly greater impurity doping concentration as a result of in-situ dopant introduction. Similarly, in other embodiments where channel material comprises an alloy comprising a Group IV majority constituent, the source and/or drain material deposited at block 130 also comprises predominantly the same Group IV majority constituent (e.g., SiGe alloy), but with additional impurity dopant. In other embodiments where the channel material is a Group III-V material, the source and/or drain material deposited at block 130 may comprise the same Group III and Group V majority constituents as the channel (e.g., InAs, InGaAs, GaSb, InGaSb)), along with additional impurity dopant. In other embodiments, where the channel material is a metal oxide, the source and/or drain material deposited at block 130 may also include the same metal and oxygen, along with additional impurity dopant.

In alternative embodiments, the source and/or drain material compositions differ from the channel material by their greater impurity dopant concentration, and also by their majority constituents. For such embodiments, a heterojunction is formed between the channel material and the source and/or drain material. Altering the majority lattice constituents of the source and/or drain material deposited at block 130 from those in the channel may be to reduce the activation energy of the impurity dopant introduced in-situ, or for otherwise achieving a lower source/drain material resistance. In some embodiments where channel material comprises predominantly silicon (e.g., substantially pure Si), the source and/or drain material deposited at block 130 may accordingly comprise majority constituents other than silicon, such as another Group IV constituent (e.g., substantially pure Ge, SiGe alloy, GeSn alloy, etc.), or Group III-V alloy constituents (e.g., InAs, InGaAs, GaSb, InGaSb), or a metal oxide. In each implementation, the source or drain material deposited at block 130 includes a significant electrically active impurity dopant concentration. In other embodiments where channel material comprises predominantly Ge, a first SiGe alloy, a first Group III-V alloy, or a first metal oxide semiconductor, the source and/or drain material deposited at block 130 comprises a second SiGe alloy, a second Group III-V alloy, or a second metal oxide semiconductor.

In some exemplary PMOS embodiments, source and/or drain material comprising predominantly Ge, or predominantly Ge and Sn is deposited at block 130 at a temperature of 350-400° C. Substantially pure Ge and GeSn alloys have an advantageously low energy of bond formation and a p-type impurity, such as B or Ga, may be introduced as the in-situ dopant to render the deposited material p+ doped. Depending on the majority constituent(s) of the source/drain material, other impurity dopants are also possible, such as Be for a III-V alloy (e.g., GaSb). In some exemplary NMOS embodiments, source and/or drain material comprising InAs or InGaAs is deposited at block 130 at a temperature of 350-400° C. InAs and InGaAs alloys also have an advantageously low energy of bond formation and an n-type impurity, such as Si, may be introduced as the in-situ dopant to render the deposited material n+ doped. Depending on the majority constituent(s) of the source/drain material, other impurity dopants are also possible, such as P or As for source/drain materials that is predominantly silicon.

Methods 101 continue at block 140 where the TFT structure is completed and any additional IC interconnect metallization is fabricated. Completion of the TFT structure may include the formation of contact metallization that is to couple to the source or drain material. Contact metallization may be deposited by any means as embodiments herein are not limited in this respect. The contact metallization may be deposited by PVD, CVD, or ALD, for example. The contact metallization may also be deposited by electrolytic or electroless plating. In some exemplary embodiments, at least one of Ti, Cu, Ta, Co, Ni, Pt, Pd, or Al is deposited directly on the source and/or drain material. Any of these metals, an alloy including two or more of these metals, or a compound further including nitrogen (e.g., TiN or TaN) may form a thermally stable, low-resistance contact.

Completion of the TFT structure at block 140 may further include the formation of a permanent gate stack over the channel material that was earlier deposited at block 110. Any gate dielectric, and any gate electrode material may be deposited so as to form a gate electrode that is capacitively coupled to the channel material. The gate stack may be formed over, under, or adjacent to a sidewall of the channel material. Methods 101 then end with IC die interconnection, for example, to couple terminals of multiple TFTs into BEOL circuitry. In some further embodiments, BEOL TFT circuitry is electrically interconnected to FEOL Group IV (e.g., Si or SiGe) FET circuitry through one or more metallization levels.

Figure 2:
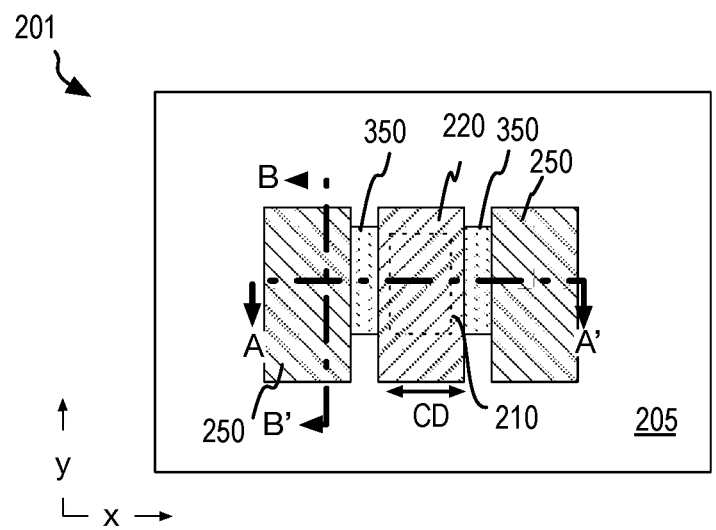
FIG. 2 is a plan view of a thin film transistor structure, in accordance with some embodiments.

FIG. 2 is a plan view of a transistor structure 201 including a channel material and regrown source and/or drain material, in accordance with some embodiments. In FIG. 2, heavy dot-dashed lines denote planes A-A' and B-B' along which cross-sectional views are further provided for various embodiments further described below. Transistor structure 201 may be arrayed over an area of a device layer within IC die, for example. Transistor structure 201 is a FET with a source terminal, a drain terminal, and a gate terminal, in accordance with some illustrative embodiments. These terminals are at least in part electrically coupled through a channel material, as well as source and/or drain material, each of which may have any of the compositions described above in the context of methods 101. Transistor structure 201 may be a planar FET, or a non-planar FET. Non-planar examples include a FinFET, Tri-Gate, and omega-gate. For both planar and non-planar embodiments, the channel region may be laterally oriented (e.g., transistor structure 201) or vertically oriented, for example as described further below.

In FIG. 2, transistor structure 201 includes a channel material 210 denoted by dotted line and extending over an area of a substrate 205 Channel material 210 is separated from at least one of a source and/or drain metallization 250 by source and/or drain material 350. Channel material 210 is semiconductor material, for example having any of the semiconductor compositions described above, such as Si, Ge, Group III-N, Group III-V, or metal oxide, etc. A gate electrode 220 has a length CD, and overlaps channel material 210. Gate electrode 220 also overlaps a portion of source or drain material 350. Gate electrode 220 may include an elemental metal layer, a metal alloy layer, or laminate structure of either or both. In some embodiments the gate electrode is a metal nitride, such as TiN. The gate electrode may also comprise Al (e.g., TiAlN). Other alloy constituents may also be employed in gate electrode 220, such as, but not limited to C, Ta, W, Pt, and Sn.

With a lateral channel layout, source and drain contact metallization 250 is on opposite sides of gate electrode 220, with a dielectric material (not depicted) between sidewalls of gate electrode 220 and contact metallization 250. Contact metallization 250 may include any of the metal(s) described above in the context of block 140 in methods 101 (FIG. 1), for example. The plan view of transistor structure 201 is applicable to a number of transistor architectures, some of which are further described in the context of FIG. 3-11. For the sake of clarity, reference numbers are repeated for features that may share the same attributes (e.g., composition).

Figure 3A:
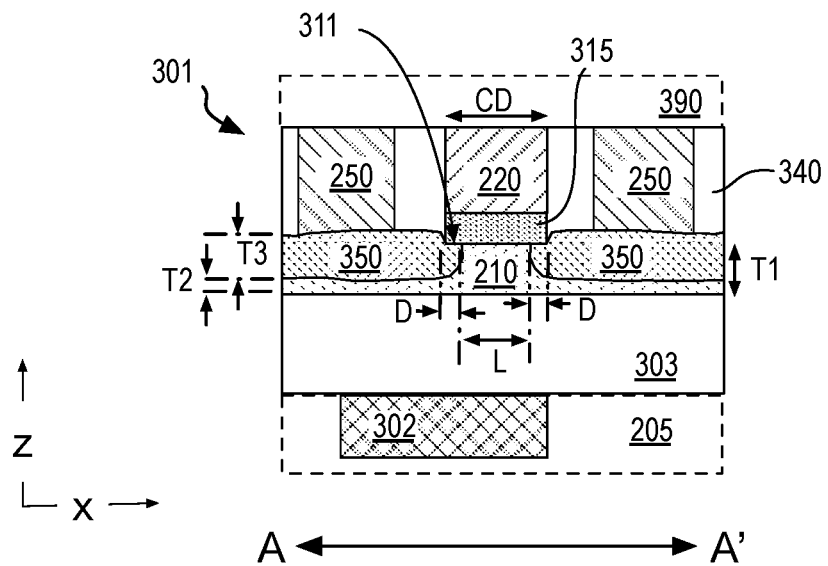
FIGS. 3A and 3B are cross sectional views of transistor structures including regrown source and drain materials along the A-A' line introduced in FIG. 2, in accordance with some embodiments.

FIG. 3A illustrates an exemplary transistor structure 301 that includes a top-side gate electrode 220 along with top-side source and drain contact metallization 250. Channel material 210 may have any thickness T1, with some examples being in the range of 5-8 nm. Channel material 210 is over a dielectric material 303, which may be any suitable material such as, but not limited to, silicon dioxide, silicon nitride, or silicon oxynitride, a low-k material having a relative permittivity below 3.5, for example. Dielectric material 303 is over substrate 205, which is illustrated in dashed line to emphasize that substrate 205 may include any number of FEOL material and/or one or more levels of interconnect metallization 302. Source and drain contact metallization 250 is embedded within a dielectric material 340, which may be any suitable material (e.g., silicon dioxide, silicon nitride, or silicon oxynitride, or a low-k material). Any number of BEOL material and/or circuitry levels 390 may be similarly over dielectric material 340.

A gate dielectric 315 is between channel material 210 and gate electrode 220. Gate dielectric 315 may be any material(s) compatible with channel material 210 and gate electrode 220. Together, gate electrode 220 and gate dielectric 315 are referred to herein as a gate stack. While any gate stack materials known to be suitable for a particular channel material may be utilized, in some exemplary embodiments the gate stack includes a high-k dielectric material (with a bulk relative permittivity greater than 9), and a metal gate electrode having a work function suitable for the channel material composition. Exemplary high-k materials include dielectric metal oxides, such as, but not In some examples, the gate dielectric comprises oxygen and at least one of Hf (e.g., $HfO_2$), Al (e.g., $Al_2O_3$), Zr (e.g., $ZrO_2$), Y (e.g., $Y_2O_3$), Ta (e.g., $Ta_2O_5$), or Ti (e.g., $TiO_2$). Silicates, such as, but not limited to $HfSiO_x$, or $TaSiO_x$ may also be suitable. In other embodiments gate dielectric 315 is $SiO_2$, or SiON.

In the "top-gate" architecture illustrated in FIG. 3A, channel material 210 has a lateral (e.g., x-dimension) gate length L that is dependent on the spacing of source or drain material 350 rather than a spacing between source/drain contact metallization 250. As shown, channel length L is smaller than the length CD of gate electrode 220 because of an undercut 311 where there is source or drain material 350 below gate electrode 220. Gate electrode length CD may be defined by some minimum lithographic feature resolution (e.g., 5-10 nm), for example. Undercut 311 defines an amount of gate electrode overlap D so that channel length L is approximately equal to gate electrode length CD minus 2D. Gate overlap D may vary, with some examples being in the range of 1-3 nm Channel length L may therefore be 2-6 nm smaller than gate electrode CD. For some embodiments where CD is in the range of 5-10 nm, channel length L may be in the range of 1-5 nm.

Source or drain material 350 separates contact metallization 250 from channel material 210. Source or drain material 350 may have any of the p-type or n-type compositions described above in the context of methods 101 (e.g., block 130 of FIG. 1). As noted above source or drain material 350 may have the same morphology a channel material 210, or a different morphology. The boundary between channel material 210 and source or drain material 350 illustrated in black line demarks an interface between differing material compositions and/or microstructures.

As a result of gate undercut 311 that is symmetrical about gate electrode 220, gate dielectric 315 is not only between channel material 210 and gate electrode 220, but is also between gate electrode 220 and overlapped portions of source or drain material 350. In the example shown in FIG. 3A, source or drain material 350 separates channel material 210 from contact metallization 250 at both the transistor source and drain terminals. Beyond gate undercut 311, source or drain material 350 has a material thickness T3 that vertically spaces (e.g., in the z-dimension) contact metallization 250 from channel material 210. Source and drain material thickness T3 may be as little as 3-5 nm, for example, but may be 10 nm, or more. In some embodiments, source and drain material thickness T3 is sufficient to elevate or raise the interface between contact metallization 250 and source or drain material 350 above the interface between gate dielectric 315 and a portion of the source or drain material 350 within gate undercut 311. Within gate undercut 311, source or drain material 350 has a material thickness that is less than T3, and no more than channel material thickness T1.

Transistor structure 301 may be fabricated according to a variety of techniques. In some embodiments, methods 101 are employed, for example with channel material 210 deposited over dielectric material 303 at block 110. Gate stack materials, or a sacrificial mandrel material, may then be deposited over channel material 210 and patterned into a gate mask. Recesses may then be etched into portions of the channel material 210 not protected by the gate mask. The recesses may be etched with any process having isotropic character to laterally undercut the gate stack. Source or drain material 350 may be deposited over exposed surfaces of channel material 210, for example with any of the low-temperature, in-situ doped material deposition techniques described above in the context of methods 101 (e.g., block 130, FIG. 1). Where the deposition process is sufficiently selective, source or drain material 350 backfills the lateral undercut without accumulating on sidewalls of the gate mask.

Following regrowth of source or drain material 350, dielectric material 340 may be deposited over source or drain material 350, and planarized with the gate mask. If the gate mask was a sacrificial mandrel material, it may then be replaced with gate dielectric 315 and/or gate electrode 220. Transistor structure 301 may be completed by forming contact openings that expose a portion of source or drain material 350, and depositing contact metallization 250 within the contact openings.

Figure 3B:
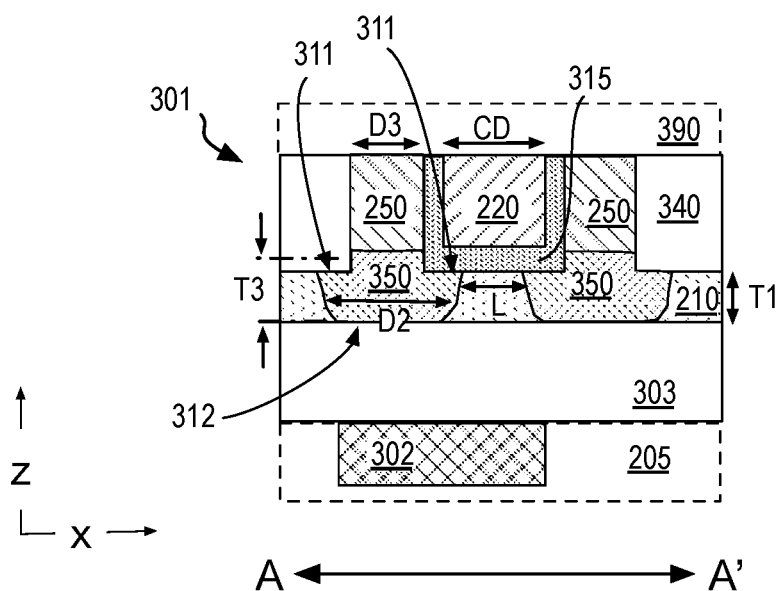

In FIG. 3A, source or drain material 350 is separated from underlying dielectric material 303 by a channel material 210 thickness T2. The presence of channel material 210 below source or drain material 350 is indicative of a source/drain recess etch that was of insufficient duration to clear channel material thickness T1. FIG. 3B illustrates an alternative embodiment of transistor structure 301 where a source/drain recess etch was of sufficient duration to clear channel material thickness T1. Source or drain material 350 therefore extends completely through channel material thickness T1, and is in contact with a surface 312 of dielectric material 303. For such embodiments, where source and drain material thickness T3 is greater than channel material thickness T1, source or drain material 350 beyond undercut 311 is elevated, or raised, above channel material 210.

FIG. 3B also illustrates an embodiment where gate dielectric material 315 separates a sidewall of contact metallization 250 from a sidewall of gate electrode 220. Source or drain material 350 again includes a portion within gate undercut 311 that has a thickness no more than thickness T1, and less than thickness T3. In contrast to the transistor structure illustrated in FIG. 3A, source or drain material 350 has a lateral dimension D2 that is centered about contact metallization 250 of lateral dimension D3. An undercut portion of source or drain material 350 symmetrically encircles contact metallization 250, which is indicative of a source/drain recess having been etched in alignment with a contact opening that has been subsequently backfilled with both source or drain material 350 and contact metallization 250. For embodiments where contact openings are self-aligned to gate dielectric 315 (or some dielectric material spacer adjacent to a sidewall of gate electrode 220), channel length L may still be a well-controlled function of gate electrode length CD.

Figure 4:
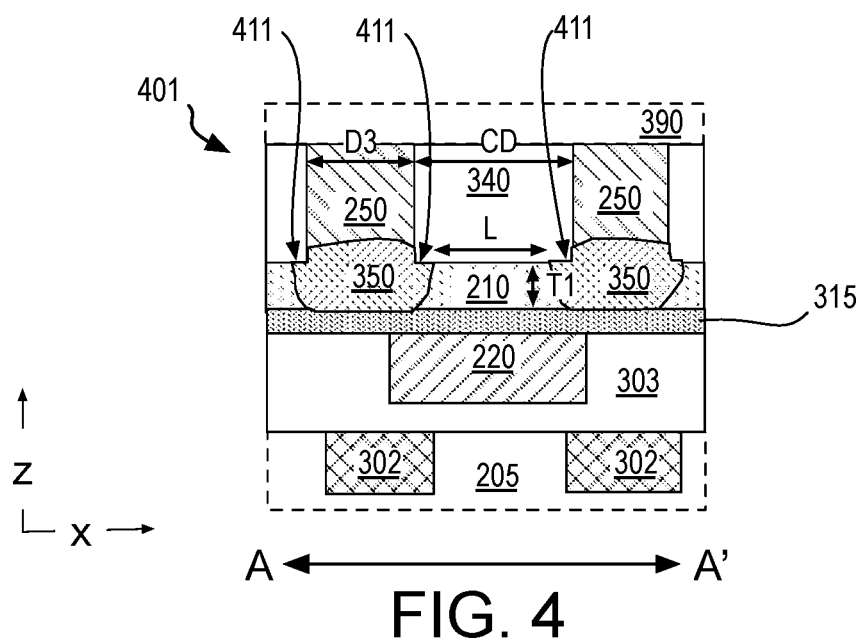
FIGS. 4, 5, 6, 7 and 8 are cross sectional views of transistor structures including regrown source and drain materials along the A-A' line introduced in FIG. 2, in accordance with some embodiments.

While some exemplary top-gate architectures are illustrated in FIGS. 3A and 3B, regrown impurity-doped source and drain material in accordance with embodiments herein may also be implemented within other thin film transistor architectures. FIG. 4 illustrates an exemplary transistor structure 401 that includes gate electrode 220 on a bottom side of channel material 210, and source and drain contact metallization 250 on a top side of channel material 210. Although such a bottom-gate device architecture may display higher parasitic capacitance than some top-gate devices, the bottom-gate device depicted in FIG. 4 illustrates how low-temperature source and/or drain material may nevertheless be implemented for reduced parasitic resistance.

In transistor structure 401, gate dielectric 315 is again between gate electrode 220 and channel material 210, as well as between gate electrode 220 and overlapped portions of source or drain material 350. Transistor structure 401 may be fabricated according to a variety of techniques. In some embodiments, methods 101 are employed, for example with channel material 210 deposited over gate electrode 220 and gate dielectric 315 at block 110 (FIG. 1). As evident from transistor structure 401, source or drain material 350 may be selectively deposited on surfaces of channel material 210 that are exposed within recesses that have been etched into portions of the channel material 210 not protected by an overlying mask. The recesses may have been etched with a process having isotropic character to laterally undercut the mask and define channel length L that is less than the overlying mask dimension CD. Where the source and drain material deposition process is sufficiently selective, source or drain material 350 backfills the lateral undercut without accumulating on sidewalls of the gate mask, allowing contact metallization 250 to be deposited within contact openings.

For this bottom-gate architecture, channel length L is independent of gate CD (e.g., x-dimension), so gate electrode 220 may extend under source or drain material 350 for an arbitrary amount of overlap. As shown, channel length L is dependent on lateral distance between sidewalls of two portions of source or drain material 350 with at least dielectric material 340 therebetween. Similar to the embodiment shown in FIG. 3B, source or drain material 350 is centered about contact metallization 250 with source or drain material 350 including an undercut portion 411 that encircles contact metallization 250. Within undercut 411, source or drain material 350 has a thickness no more than thickness T1, and less than thickness T3.

Figure 5:
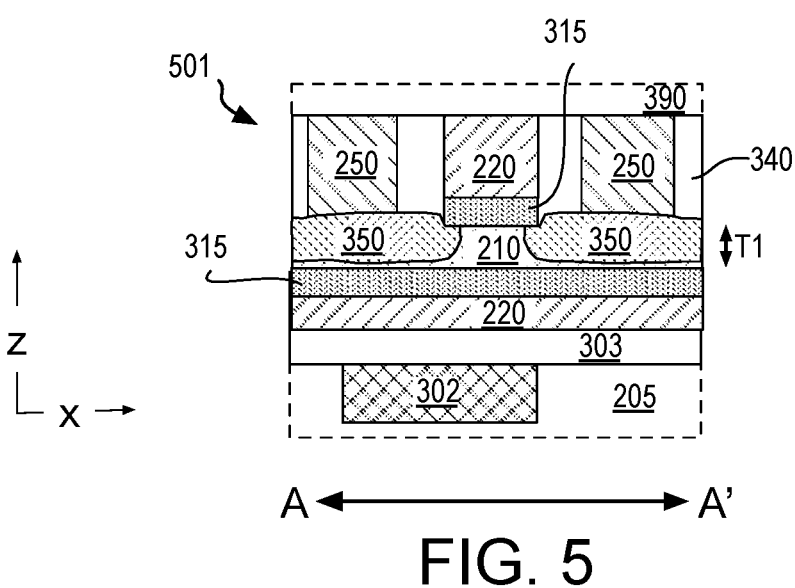

FIG. 5 illustrates a cross-sectional view of a double gate transistor structure 501, in accordance with some further embodiments that add a bottom gate 220 to the top-side three terminal transistor structure 301 (FIG. 3A). An alternative double gate transistor structure may be similarly derived from bottom-gate transistor structure 401. For any such double-gate transistor structures, channel material 210 may have any of the compositions described above. Likewise, source or drain material 350 may have any of the composition described above for either p-type or n-type embodiments.

Figure 6:
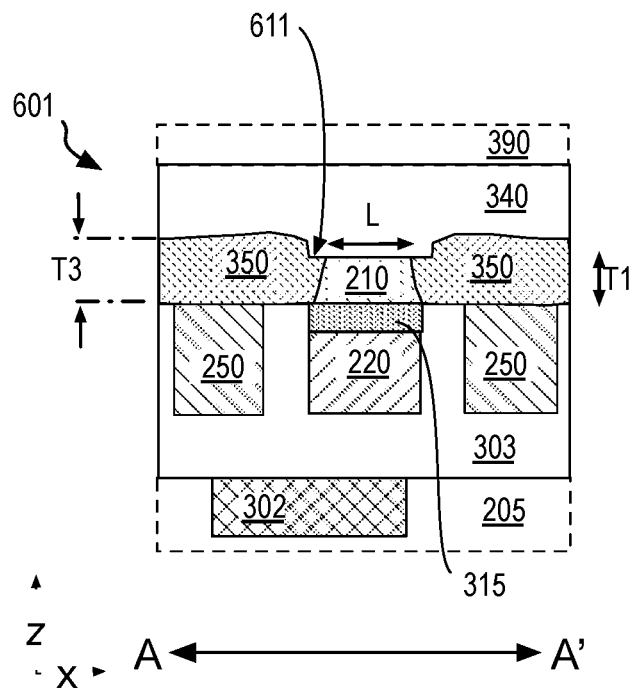

FIG. 6 illustrates a transistor structure 601 that includes a bottom-side gate electrode 220 along with bottom-side contact metallization 250. In this FET architecture, source or drain material 350 is again between channel material 210 and contact metallization 250. Similar to bottom-gate transistor structure 401, transistor channel length L is independent of physical dimensions of gate electrode 220. Low resistance source or drain material 350 spans a lateral spacing between electrode 220 and contact metallization 250.

As further shown in FIG. 6, source or drain material 350 includes an elevated or raised portion having a thickness T3 that exceeds channel material thickness T1. Source or drain material 350 further includes a portion within undercut 611 having a thickness less than T3 (e.g., approximately equal to thickness T1). Transistor structure 601 may be fabricated, for example, substantially as described above for transistor structure 401, but with channel material 210 deposited over both gate dielectric 315 and contact metallization 250 Channel material 210 is then masked, for example with a sacrificial mandrel material, which is then undercut during an etch of channel material 210. Source or drain material 350 may then be laterally overgrown selectively from an exposed sidewall surface of channel material 210.

Figure 7:
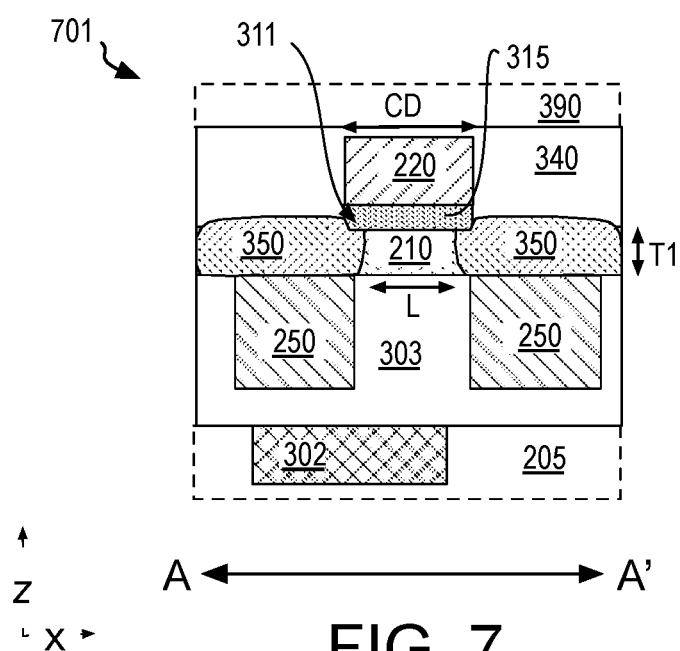

In FIG. 7, transistor structure 701 comprises gate electrode 220 on a top-side of channel material 210. Source or drain material 350 couples channel material 210 to contact metallization 250 that is on a bottom side of channel material 210. Device terminals of transistor structure 701 are therefore inverted from those of transistor structure 401 (FIG. 4). As shown in FIG. 7, gate electrode 220 is embedded within a dielectric material 340 while source/drain metallization 250 is embedded in dielectric material 303 with channel material 210 between the two layers of dielectric material. In this alternative "top-gate" architecture illustrated in FIG. 7, transistor channel length L is again independent of the spacing between source/drain contact metallization 250, and instead dependent on the lateral spacing between the source or drain material 350, which may be less than some gate electrode CD (e.g., 10-20 nm pitch) as a result of gate undercut 311 where source or drain material 350 has a thickness no greater than channel material thickness T1.

Figure 8:
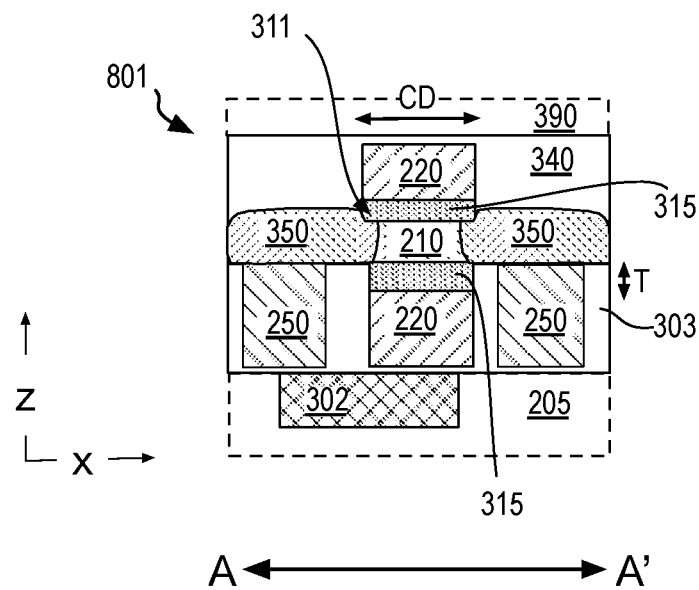

FIG. 8 depicts a double gate transistor structure 801 that includes terminals inverted from those of transistor structure 501 (FIG. 5). Transistor structure 801 therefore again includes gate dielectric 315 under, and over, channel material 210. Fabrication of transistor structure 801 may proceed with the fabrication of contact metallization 250, and a first gate stack according to any suitable techniques. The channel material 210 may then be deposited, and a gate mask comprising a second gate dielectric 315 and gate electrode 220 subsequently formed over channel material 210 Channel material 210 may then be etched, for example in alignment with the gate mask, so that an edge portion of the gate mask is laterally undercut. Source or drain material 350 may then be deposited, for example with a low-temperature deposition including in-situ impurity doping.

Figure 9:
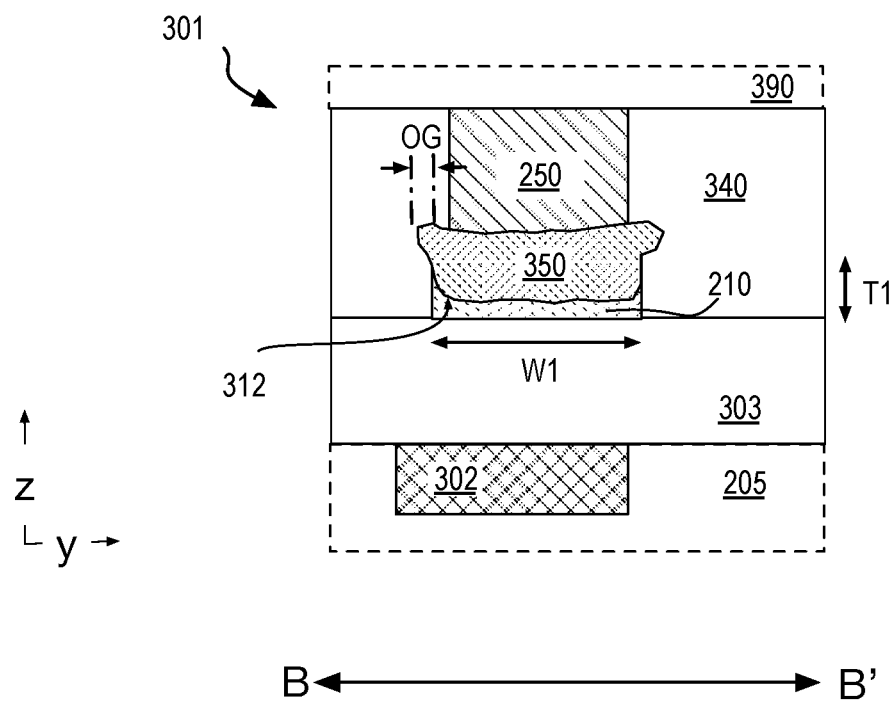
FIGS. 9, 10, and 11 are cross sectional views of transistor structures including regrown source and drain materials along the B-B' line introduced in FIG. 2, in accordance with some embodiments.

FIG. 9 is a cross-sectional view of transistor structure 301 (FIG. 3A) along the B-B' line introduced in FIG. 2 that extends through contact metallization 250. Many of the features shown in FIG. 9 are also applicable to other transistor structures that have top side contact metallization (e.g., transistor structure 401 or 501). As shown in FIG. 9, channel material 210 has a lateral channel width W1 Channel width W1 may be, for example, a minimum lithographically defined feature geometry (e.g., 10-30 nm). As further denoted in FIG. 9, source or drain material 350 is only in contact with a top surface of channel material 210. However, any of the transistor structures described above may instead have a wrap-around source/drain contact metallization architecture where source or drain material 350 is adjacent to a sidewall of channel material 210 in addition to being over the top surface of channel material 210. In accordance with some embodiments, source or drain material 350 extends beyond channel width W1 by a lateral overgrowth distance OG. Such lateral overgrowth is indicative of source or drain material 350 being a supplemental material that has been added to, rather than converted from, channel material 210.

Figure 10:
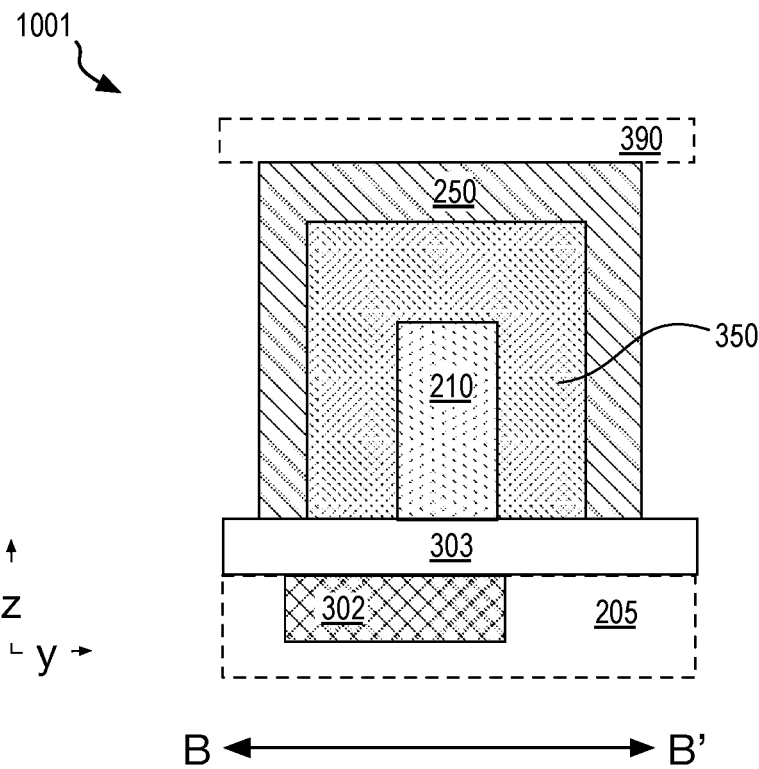

FIG. 10 is a cross-sectional illustration through a transistor structure 1001, substantially along the B-B' line illustrated in FIG. 2. As shown in FIG. 10, transistor structure 1001 includes non-planar channel material 210. Fabrication of transistor structure 1001 may entail the deposition of a channel material followed by a patterning of the channel material to generate a non-planar feature having a sidewall. Source or drain material 350 may then be selectively deposited over this non-planar feature so as to be adjacent to a sidewall of channel material 210. Contact metallization 250 may then be deposited over the source or drain material 350, for example with contact metallization 250 then being adjacent to a sidewall of source or drain material 350.

Impurity-doped regrown source and/or drain material may also be integrated into transistor structures that have non-planar channel architectures. For example, a channel material may be over an underlying topographic feature. For such embodiments, a mandrel may be formed over a substrate. The mandrel may be sacrificial, or a permanent feature of a transistor structure. In some embodiments, the mandrel comprises a dielectric material that is patterned into a feature, such as, but not limited to, a pillar, a line, or any other polygon known to be suitable as a backbone for a double-patterning (e.g., pitch splitting) process. For other embodiments, for example where the mandrel is to further functional as a terminal of the transistor structure, the mandrel may comprise any of a gate electrode (and gate dielectric), a source terminal contact metallization, or a drain terminal contact metallization.

Channel material may be deposited over at least a sidewall of the mandrel, for example at block 110 of methods 101 (FIG. 1). In some embodiments, the channel material is blanket deposited over the top surface and sidewall of a mandrel structure, as well as over a field portion of the substrate between adjacent mandrel structures. The channel material may then be patterned into separate bodies. The mandrel structure may then be selectively removed in sacrificial mandrel embodiments, and potentially replaced, for example, with a gate electrode or source/drain structure. Following formation of the non-planar channel material, transistor fabrication may proceed substantially as described above in the context of planar channel architectures. For example, source and drain material may then be selectively deposited over a surface of the non-planar channel to define a channel length of the transistor structure.

Figure 11:
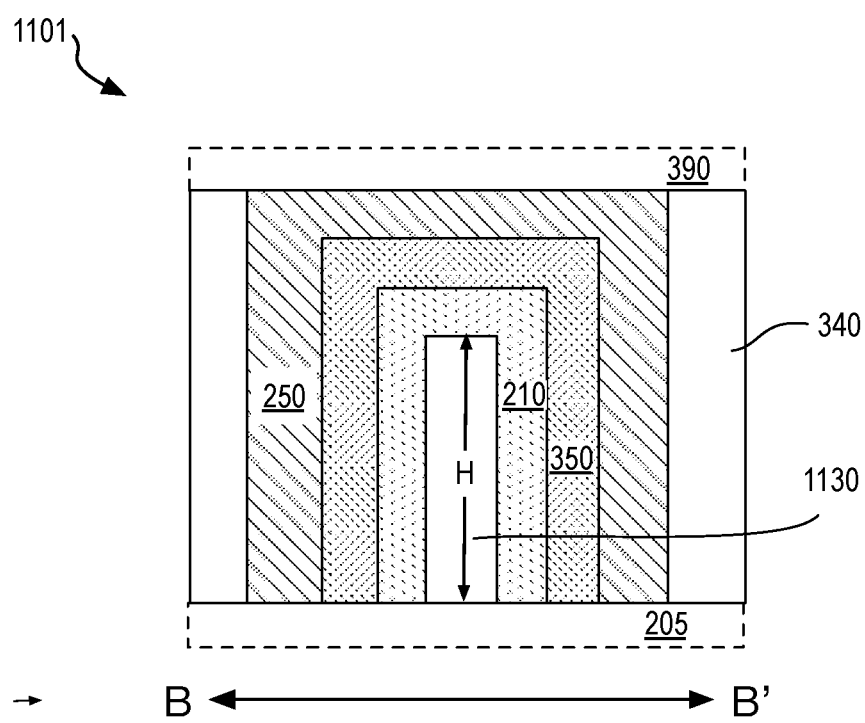

FIG. 11 illustrates an exemplary transistor structure 1101 along the B-B' line introduced in FIG. 2. As shown in FIG. 11, source and/or drain material 350 has been deposited over a non-planar channel material 210, which was deposited over mandrel structure 1130. Channel material 210 therefore has a channel width that is approximately equal to twice a height H (e.g., z-dimension) of mandrel structure 1130 summed with a width (e.g., y-dimension) of mandrel structure 1130. Height H may vary, but may be 20-50 nm, for example. For transistor structure 1101, source or drain material 350 is adjacent to sidewalls of channel material 210, and contact metallization 250 is adjacent to sidewalls of source or drain material 350.

A variety of exemplary TFT architectures have been described to illustrate how a regrown source or drain material may be integrated into a TFT suitable for BEOL integration. Any of these transistor architectures may be further integrated within a given device level of an IC. A CMOS circuit may be fabricated by interconnecting both PMOS and NMOS variants of one or more of the transistor structures described above. In some embodiments, PMOS TFTs having any of the attributes described above are fabricated within a first TFT device level, while NMOS TFTs having any of the attributes described above are fabricated within a second TFT device level. In other embodiments, both PMOS and NMOS TFTS, each having any of the attributes described above, are fabricated within one TFT device level.

Figure 12:
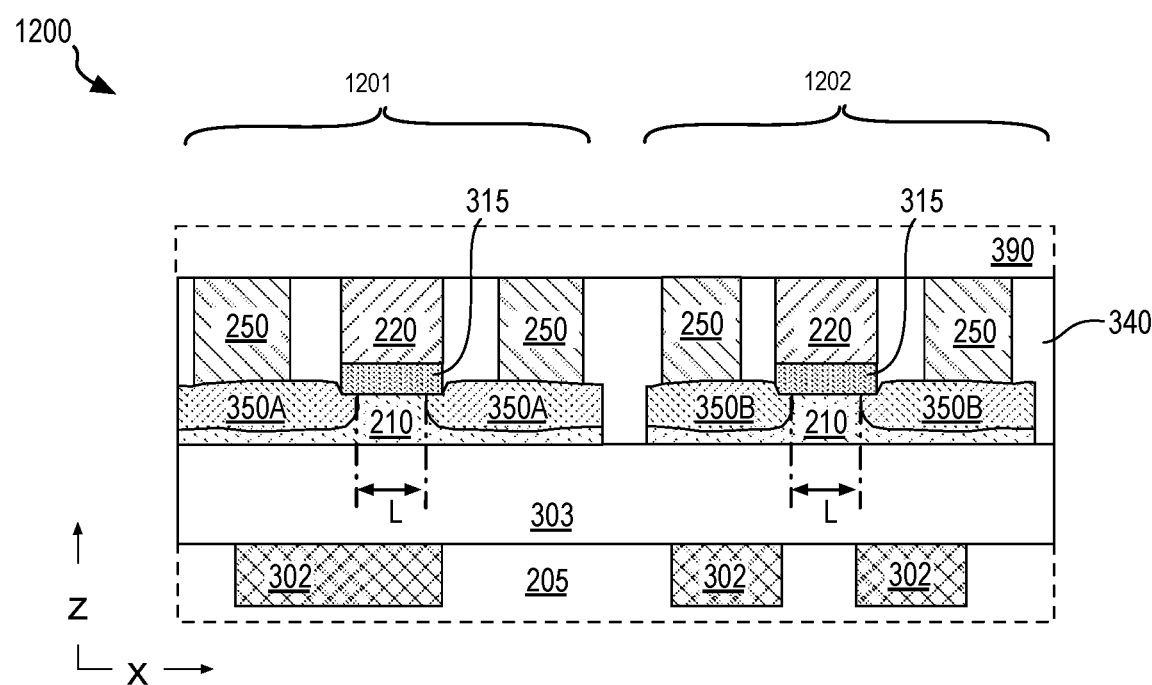
FIG. 12 is a cross sectional view of a CMOS device structure including both an NMOS and a PMOS thin film transistor, in accordance with some embodiments.

In FIG. 12, for example, illustrates a cross-sectional side view of a CMOS device structure 1200 that includes a PMOS TFT 1201 over a first region of substrate 205, and a NMOS TFT 1202 over a second, adjacent, region of substrate 205. PMOS TFT 1201 comprises a top-gate transistor structure, substantially as described above for transistor structure 301, but with a first source or drain material 350A that comprises p-type impurities. Source or drain material 350A may, for example, include at least Ge doped with B or Ga, for example. NMOS TFT 1202 also comprises a top-gate transistor, substantially as described above for transistor structure 301, but with a second source or drain material 350B that comprises n-type impurities. Source or drain material 350B may, for example, include at least In doped with Si or Be, for example Channel material 210 may be substantially identical for both TFTs 1201 and 1202. In the illustrated example, dielectric material 340 electrically isolates PMOS TFT 1201 from NMOS TFT 1202. Fabrication of CMOS device structure 1200 may be according to any technique(s). For example, features common to PMOS TFT 1201 and NMOS TFT 1202 may be fabricated concurrently, which source or drain materials 350A and 350B may be fabricated in series with one region of the substrate masked while processing the other region.

Figure 13:
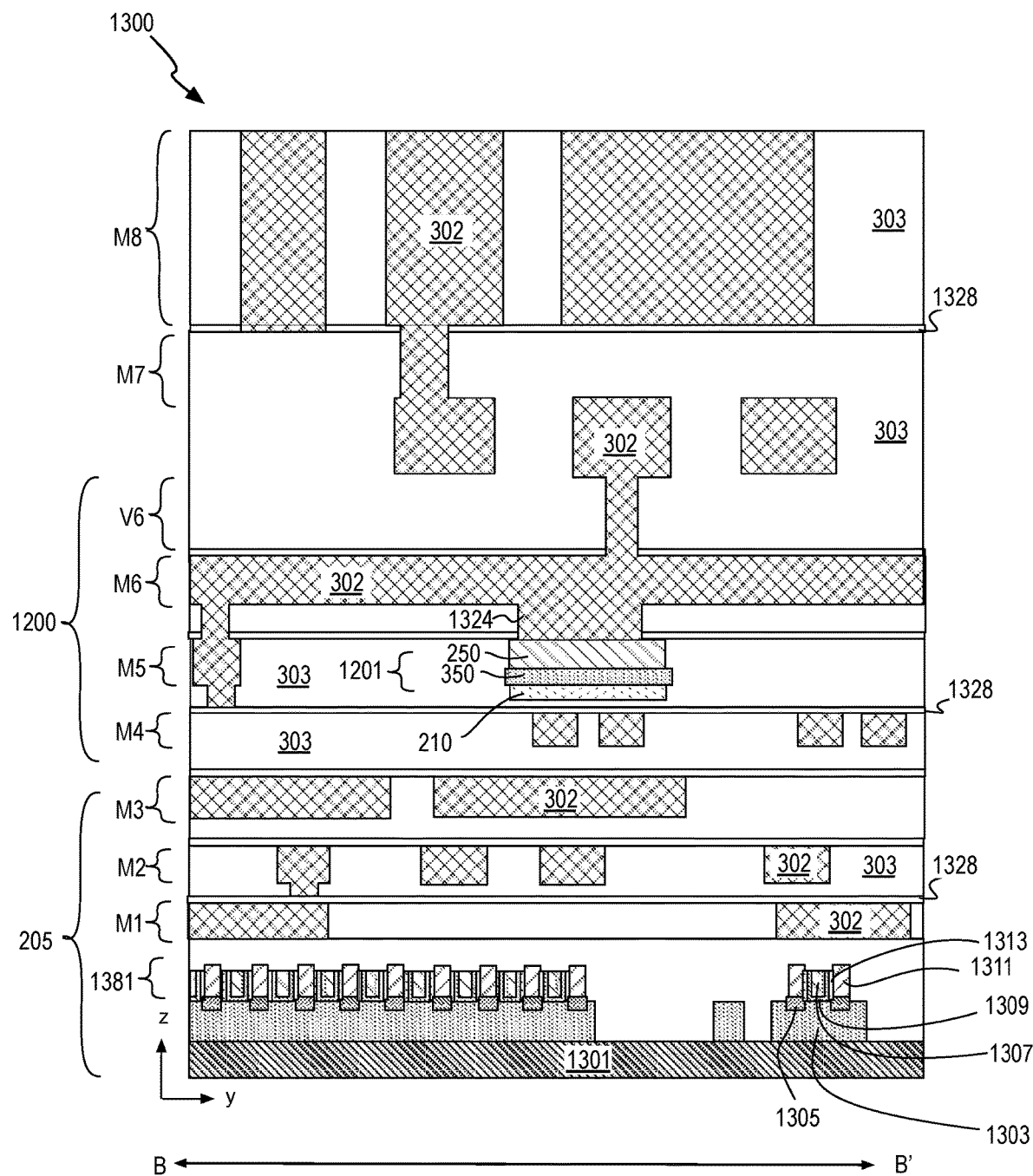
FIG. 13 illustrates a cross-sectional view of a monolithic 3DIC structure including TFT circuitry over CMOS FET circuitry, in accordance with some embodiments.

Any of the device structures described above may be further integrated into an IC chip. FIG. 13 illustrates a cross-sectional side view of a 3D IC structure 1300, in accordance with some embodiments. Structure 1300 illustrates a portion of a monolithic IC that includes a substrate 205 that comprises FEOL device circuitry fabricated over and/or on a single crystalline substrate 1301. In this example, FEOL device circuitry includes a plurality of MOSFETs 1381 that employ a monocrystalline semiconductor material 1303 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.).

FETs 1381 include a gate terminal 1307 separated from a semiconductor material 1303 by a gate dielectric 1309. The channel region of semiconductor material 1303 separates source/drain 1305. Contact metallization 1311 is in contact with source/drain 1305 and is separated from gate terminal 1307 by an intervening dielectric spacer 1313. Any materials known to be suitable for FETs may be present in FEOL FETs 1381. FETs 1381 may be planar or non-planar devices. In some advantageous embodiments, FETS 1381 are finFETs. FETs 1381 may include one or more semiconductor materials. As one example, semiconductor material 1303 is a surface layer of a substantially monocrystalline substrate 1301. Substrate 1301 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 302 electrically insulated by dielectric materials 303 and 1328. In the exemplary embodiment illustrated, FEOL device circuitry includes metal-one (M1), metal-two (M2) and metal-three (M3) interconnect metallization levels. Interconnect metallization 302 may be any metal(s) suitable for FEOL and/or BEOL IC interconnection. Interconnect metallization 302 may be, for example, an alloy of predominantly Ru or Cu, an alloy of predominantly W, or an alloy of predominantly Al, etc. Dielectric material 1328 has a different composition that dielectric material 303, and may be of a composition that has a higher dielectric constant than that of dielectric material 303, for example. In some examples where dielectric material 303 is predominantly silicon and oxygen (i.e., $SiO_x$), dielectric material 1328 is predominantly silicon and nitrogen (i.e., $SiN_x$).

BEOL device circuitry is located over the FEOL device circuitry, with dielectric material 303 therebetween. BEOL device circuitry includes CMOS device structure 1200. In the exemplary embodiment illustrated, PMOS TFT structure 1201 is a "top-gate" structure with source or drain material 350 coupling contact metallization 250 to channel material 210. Although top-contact devices are illustrated, embodiments herein are also applicable bottom-contact transistor architectures, side-contact transistor architectures, or other planar and non-planar transistor architectures, such as any of those described above.

BEOL circuitry may comprise any number of metallization levels, such as a metallization level (e.g., M6) immediately above the metallization level (e.g., M5) in which transistor structures reside. As further shown, a via 1324 electrically connects interconnect metallization levels to contact metallization 250. Any number of interconnect metallization levels may couple BEOL circuitry to the underlying FEOL device circuitry. In the example shown in FIG. 13, metallization levels of BEOL circuitry (e.g., M8) may be routed down through any number of metallization levels (e.g., M8-M3) to be in electrical communication with one or more FEOL transistors 1381.

In further embodiments, there may be multiple levels of BEOL device circuitry located over the FEOL device circuitry, each with dielectric material therebetween. Each level of BEOL device circuitry may include a plurality of transistor structures.

In other embodiments, a 3DIC may include one or more levels of the BEOL device circuitry without any monocrystalline FEOL transistors. For such embodiments, the BEOL devices may be over any substrate (e.g., polymer, glass, etc.). Hence, transistors with oxide semiconductor channels and contact buffers may be employed in conjunction with monocrystalline channeled devices, or not.

Figure 14:
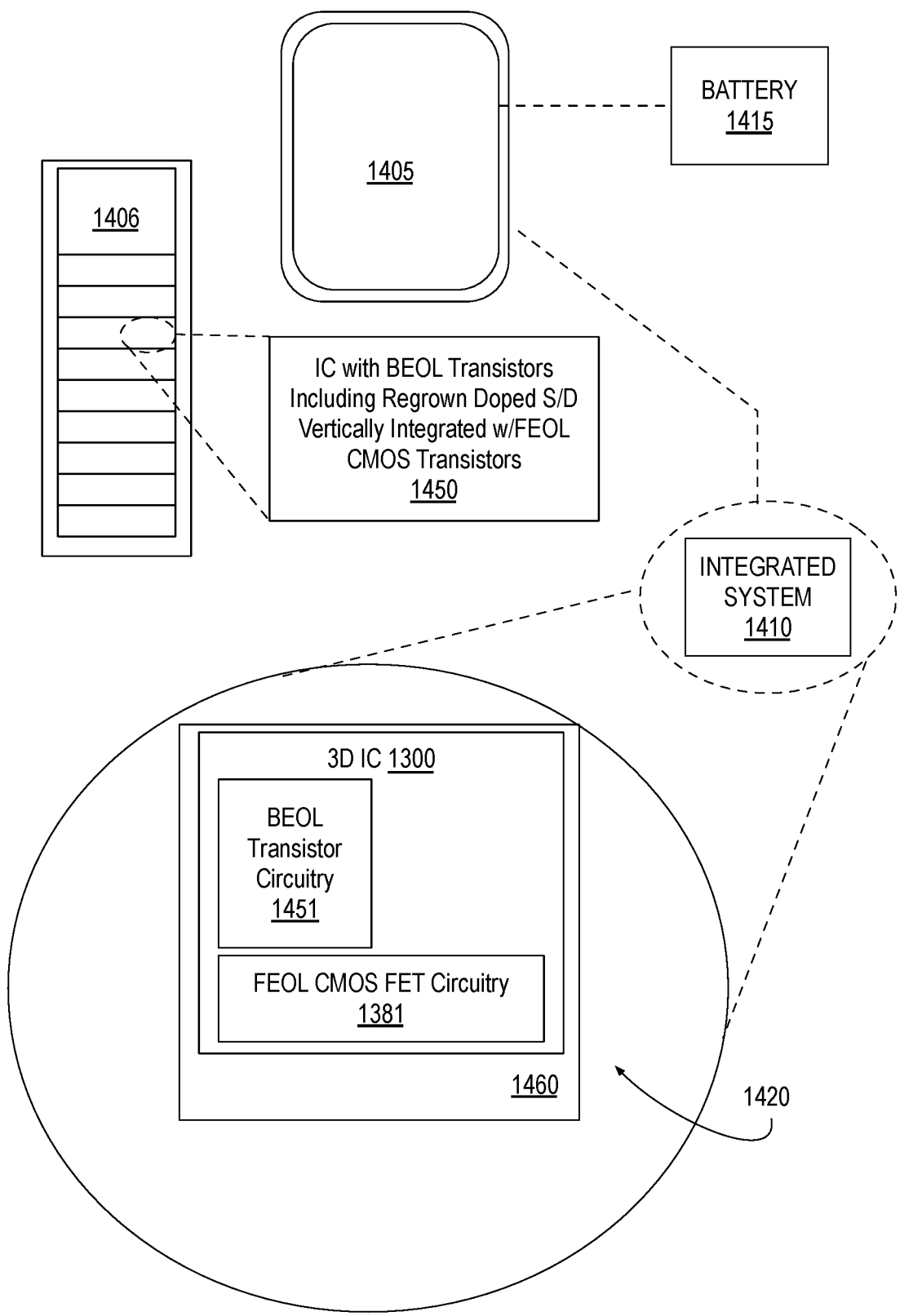
FIG. 14 illustrates a system employing an IC including TFT circuitry over CMOS FET circuitry, in accordance with some embodiments.

FIG. 14 illustrates a system in which a mobile computing platform 1405 and/or a data server machine 1406 employs an IC including at least one back-end semiconductor device with regrown impurity-doped source or drain material. Such a back-end semiconductor device may be over a front-end semiconductor device, in accordance with some embodiments. The server machine 1406 may be any commercial server, for example including any number of high-performance computing platforms disposed within a rack and networked together for electronic data processing, which in the exemplary embodiment includes a packaged monolithic IC 1450. The mobile computing platform 1405 may be any portable device configured for each of electronic data display, electronic data processing, wireless electronic data transmission, or the like. For example, the mobile computing platform 1405 may be any of a tablet, a smart phone, laptop computer, etc., and may include a display screen (e.g., a capacitive, inductive, resistive, or optical touchscreen), a chip-level integrated system 1410, and a battery 1415.

Whether disposed within the integrated system 1410 illustrated in the expanded view 1420, or as a stand-alone packaged chip within the server machine 1406, monolithic 3D IC 1300 includes a memory chip (e.g., RAM), or a processor chip (e.g., a microprocessor, a multi-core microprocessor, graphics processor, or the like) including at least one transistor with a channel semiconductor material coupled to contact metallization through regrown impurity doped source or drain material, for example, as described elsewhere herein. 3D IC 1300 may further include silicon CMOS front-end circuitry 1381 and BEOL transistor circuitry 1451. The 3D IC 1300 may be further coupled to a board, a substrate, or an interposer 1460.

3D IC 1300 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 15:
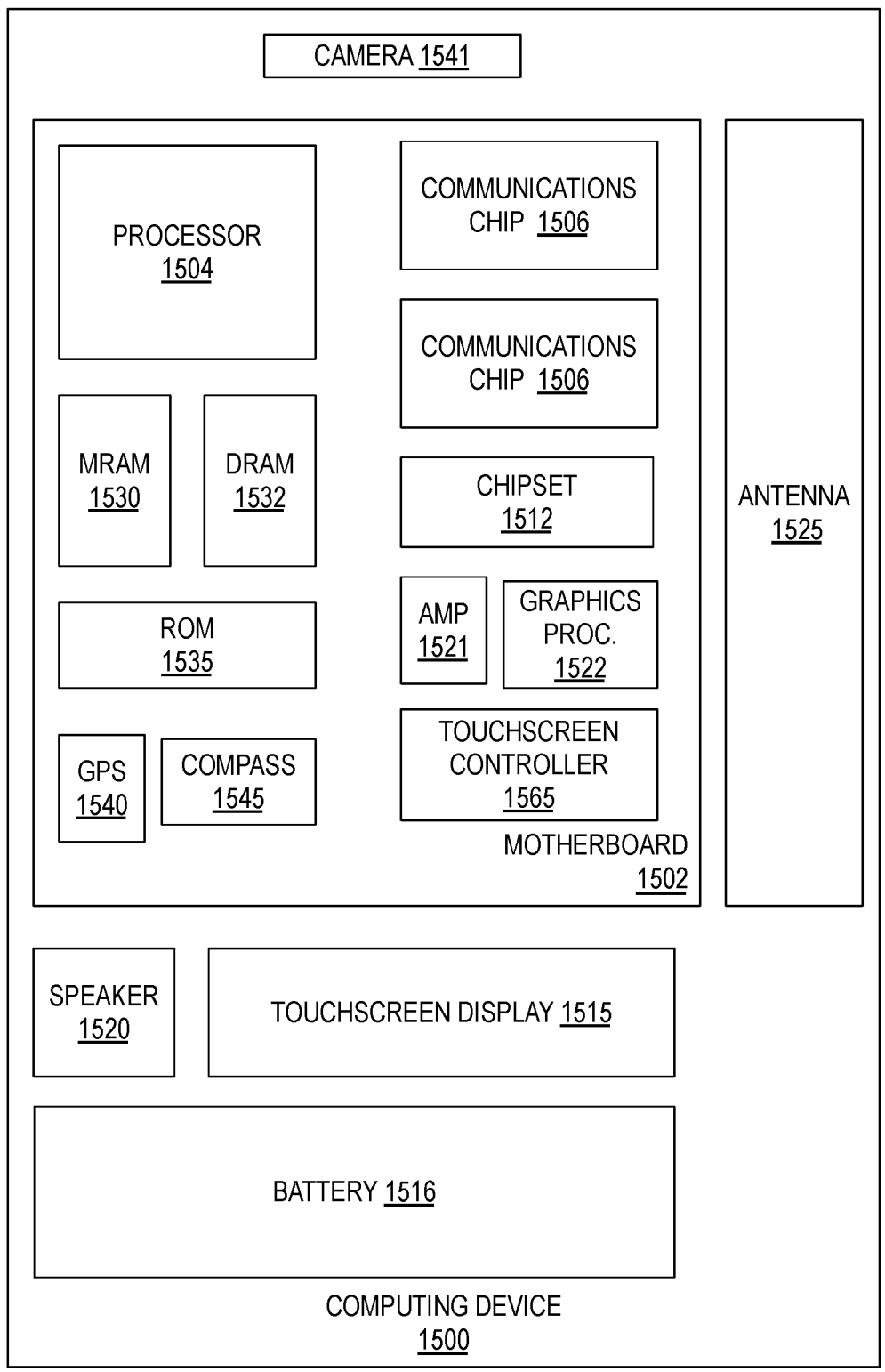
FIG. 15 is a functional block diagram illustrating an electronic computing device, in accordance with an embodiment of the present invention.

FIG. 15 is a functional block diagram of an electronic computing device 1500, in accordance with some embodiments. Device 1500 further includes a motherboard 1502 hosting a number of components, such as, but not limited to, a processor 1504 (e.g., an applications processor). Processor 1504 may be physically and/or electrically coupled to motherboard 1502. In some examples, processor 1504 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1506 may also be physically and/or electrically coupled to the motherboard 1502. In further implementations, communication chips 1506 may be part of processor 1504. Depending on its applications, computing device 1500 may include other components that may or may not be physically and electrically coupled to motherboard 1502. These other components include, but are not limited to, volatile memory (e.g., DRAM 1532), non-volatile memory (e.g., ROM 1535), flash memory (e.g., NAND or NOR), magnetic memory (MRAM 1530), a graphics processor 1522, a digital signal processor, a crypto processor, a chipset 1512, an antenna 1525, touchscreen display 1515, touchscreen controller 1565, battery 1516, audio codec, video codec, power amplifier 1521, global positioning system (GPS) device 1540, compass 1545, accelerometer, gyroscope, speaker 1520, camera 1541, and mass storage device (such as hard disk drive, solid-state drive (SSD), compact disk (CD), digital versatile disk (DVD), and so forth, or the like.

Communication chips 1506 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1506 may implement any of a number of wireless standards or protocols, including, but not limited to, those described elsewhere herein. As discussed, computing device 1500 may include a plurality of communication chips 1506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below In first examples, an integrated circuit (IC) structure comprises one or more levels of metallization, and a transistor structure over at least one of the levels of metallization. The transistor structure comprises a source material separated from a drain material by a first length of channel material. The channel material has a first composition, and the source material and the drain material have a second composition, different than the first composition. The transistor structure comprises a gate electrode separated from the channel, source and drain materials by one or more gate dielectric materials. The gate electrode has a second length, in a direction parallel to the first length, that is larger than the first length. The transistor structure comprises a source contact metallization coupled to the source material, and a drain contact metallization coupled to the drain material.

In second examples, for any of the first examples the channel material has a first microstructure and each of the source material and the drain material have a second microstructure, and a boundary between the first and second microstructures overlaps the second length.

In third examples, for any of the first through second examples the channel material has a first thickness and wherein at least a first portion the source material and at least a first portion of the drain material have a second thickness, greater than the first thickness.

In fourth examples, for any of the first through third examples, a second portion of the source material that overlaps the second length, and a second portion of the drain material that overlaps the second length, have a third thickness that is less than the second thickness.

In fifth examples, for any of the fourth examples the third thickness is less than the first thickness.

In sixth examples, for any of the first through fifth examples the channel material comprises a Group IV, a Group III-V, or metal oxide material.

In seventh examples, for any of the sixth examples the source material and the drain material comprise a second Group IV, a Group III-V, or metal oxide material.

In eighth examples, for any of the source material and the drain material comprises at least one of Ge or Sn, and one or more p-type impurity dopants at an impurity concentration of at least $7 \times 10^{20}$ atoms/cm$^3$.

In ninth examples, for any of the eighth examples the p-type impurity dopants comprise at least one of B or Ga.

In tenth examples, for any of the ninth examples the source material and drain material comprises more Ge or Sn than the channel material.

In eleventh examples, for any of the sixth examples, the source material and the drain material comprises at least one of In, Ga, As and one or more n-type impurity dopants at an impurity concentration of at least $7 \times 10^{20}$ atoms/cm$^3$.

In twelfth examples, for any of the eleventh examples the n-type impurity dopants comprise Si.

In thirteenth examples, for any of the sixth examples, source material and drain material comprises a same major constituent as the channel material, and wherein the source material and the drain material comprises a higher concentration of one or more impurity dopants.

In fourteenth examples, an integrated circuit (IC) structure comprises a plurality of complementary metal-oxide-semiconductor (CMOS) field effect transistor (FET) structures. Individual ones of the CMOS FET structures comprise a crystalline Group IV material. The IC structure further comprises a plurality of CMOS thin film transistor (TFT) structures, the CMOS TFT structures comprising an NMOS TFT. The NMOS TFT comprises an n-type source material separated from an n-type drain material by a first length of channel material, wherein the channel material has a first composition, and the source and the drain materials have a second composition, different than the first composition. The NMOS TFT comprises a first gate electrode separated from the channel, n-type source material, and n-type drain material by one or more gate dielectric material. The first gate electrode has a second length, in a direction parallel to the first length, that is larger than the first length. The NMOS TFT comprises a source contact metallization coupled to the n-type source material, and a drain contact metallization coupled to the n-type drain material. The CMOS TFT structures comprising a PMOS TFT. The PMOS TFT comprises a p-type source material separated from a p-type drain material by a third length of channel material having the first composition. The p-type source and drain materials have a third composition, different than the first and second compositions. The PMOS TFT comprises a second gate electrode separated from the channel material, p-type source material, and p-type drain material by the one or more gate dielectric materials. The second gate electrode has the fourth length, in the direction parallel to the third length, that is larger than the third length. The PMOS TFT comprises a source contact metallization coupled to the p-type source material, and a drain contact metallization coupled to the p-type drain material.

In fifteenth examples, for any of the fourteenth examples, the first composition comprises predominantly one or more Group IV elements, predominantly Group III and Group V elements, or predominantly oxygen and one or more metals. The second composition comprises predominantly one or more of In or As, and one or more n-type impurity dopants at an impurity concentration of at least $7 \times 10^{20}$ atoms/cm$^3$. The third composition comprises predominantly one or more of Ge or Sn, and one or more p-type impurity dopants at an impurity concentration of at least $7 \times 10^{20}$ atoms/cm$^3$.

In sixteenth examples, for any of the fourteenth through fifteenth examples the p-type impurity dopants comprise at least one of B or Ga, and the n-type impurity dopants comprise Si.

In seventeenth examples, for any of the fourteenth through sixteenth examples the channel material has a first thickness and wherein at least a first portion the p-type and n-type source material, and at least a first portion of the p-type and n-type drain material have a second thickness, greater than the first thickness. A second portion of the n-type source material that overlaps the second length, and a second portion of the n-type drain material that overlaps the second length, have a third thickness that is less than the second thickness. A second portion of the p-type source material that overlaps the third length, and a second portion of the p-type drain material that overlaps the third length, have a third thickness that is less than the second thickness.

In eighteenth examples, a method of fabricating a transistor structure comprises receiving a substrate comprising one or more levels of interconnect metallization. The method comprises forming a first material over the one or more levels of interconnect metallization, wherein the first material has a first composition. The method comprises forming a gate stack over the first material, the gate stack comprising a gate dielectric in contact with the first material and a gate electrode in contact with the gate dielectric. The method comprises undercutting edge portions of the gate stack by etching recesses into the first material. The method comprises depositing impurity-doped material into the recesses at a temperature below 450° C. The method comprises forming contact metallization coupled to the impurity-doped material. The method comprises depositing the impurity-doped material comprises molecular beam epitaxy, chemical vapor deposition or physical vapor deposition of a majority lattice constituent and one or more impurity dopants.

In nineteenth examples, for any of the eighteenth examples forming a first material comprises depositing a first composition comprising predominantly one or more Group IV elements, predominantly Group III and Group V elements, or predominantly oxygen and one or more metals to a first thickness less than 100 nm. Etching recesses into the first material comprises etching less than the first thickness.

In twentieth examples, depositing the impurity-doped material into the recesses comprises depositing a second composition comprising predominantly one or more Group IV elements, predominantly Group III and Group V elements, or predominantly oxygen and one or more metals to a second thickness, greater than the first thickness.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) structure, comprising:
   one or more levels of metallization; and
   a transistor structure over at least one of the levels of metallization, the transistor structure comprising:
      a source material separated from a drain material by a first length of channel material, wherein the channel material has a first composition comprising a Group IV, a Group III-V, or metal oxide material, and the source material and the drain material have a second composition, different than the first composition, and comprising Sn as a majority constituent and one or more p-type impurities;
      a gate electrode separated from the channel, source, and drain materials by one or more gate dielectric materials, wherein the gate electrode has a second length, in a direction parallel to the first length, that is larger than the first length; and
      a source contact metallization coupled to the source material, and a drain contact metallization coupled to the drain material.

2. The IC structure of claim 1, wherein the channel material has a first microstructure and each of the source material and the drain material have a second microstructure, and wherein a boundary between the first and second microstructures overlaps the second length.

3. The IC structure of claim 1, wherein the channel material has a first thickness and wherein at least a first portion the source material and at least a first portion of the drain material have a second thickness, greater than the first thickness.

4. The IC structure of claim 3, wherein a second portion of the source material that overlaps the second length, and a second portion of the drain material that overlaps the second length, have a third thickness that is less than the second thickness.

5. The IC structure of claim 4, wherein the third thickness is less than the first thickness.

6. The IC structure of claim 1, wherein the channel material comprises a metal oxide material.

7. The IC structure of claim 1, wherein the source material and the drain material comprise a GeSn alloy.

8. The IC structure of claim 7, wherein the source material and the drain material comprises one or more p-type impurity dopants at an impurity concentration of at least $7 \times 10^{20}$ atoms/cm$^3$.

9. The IC structure of claim 8, wherein the p-type impurity dopants comprise at least one of B or Ga.

10. The IC structure of claim 9, wherein the source material and drain material comprises more Ge or Sn than the channel material.

11. The IC structure of claim 1, wherein the source material and the drain material comprise Ga.

12. The IC structure of claim 1, wherein the channel material has a lateral width substantially orthogonal to the first length, and wherein the source and drain materials extend beyond the lateral width.

13. The IC structure of claim 1, wherein the source contact metallization is in direct contact with the source material, and the drain contact metallization is in direct contact with the drain material.

14. An integrated circuit (IC) structure, comprising:
  a plurality of complementary metal-oxide-semiconductor (CMOS) field effect transistor (FET) structures, wherein individual ones of the CMOS FET structures comprise a crystalline Group IV material; and
  a plurality of CMOS thin film transistor (TFT) structures, the CMOS TFT structures comprising:
    an NMOS TFT, comprising:
      an n-type source material separated from an n-type drain material by a first length of channel material, wherein the channel material has a first composition, and the source and the drain materials have a second composition, different than the first composition;
      a first gate electrode separated from the channel, n-type source material, and n-type drain material by one or more gate dielectric materials, wherein the first gate electrode has a second length, in a direction parallel to the first length, that is larger than the first length;
      a source contact metallization coupled to the n-type source material; and
      a drain contact metallization coupled to the n-type drain material; and
    a PMOS TFT, comprising:
      a p-type source material separated from a p-type drain material by a third length of channel material having the first composition, wherein the p-type source and drain materials have a third composition, different than the first and second compositions, wherein a majority constituent of the p-type source material is Sn;
      a second gate electrode separated from the channel material, p-type source material, and p-type drain material by the one or more gate dielectric materials, wherein the second gate electrode has a fourth length, in the direction parallel to the third length, that is larger than the third length;
      a source contact metallization coupled to the p-type source material; and
      a drain contact metallization coupled to the p-type drain material.

15. The IC structure of claim 14, wherein:
first composition comprises predominantly one or more Group IV elements, predominantly Group III and Group V elements, or predominantly oxygen and one or more metals;
the second composition comprises predominantly one or more of In and As, and one or more n-type impurity dopants at an impurity concentration of at least $7 \times 10^{20}$ atoms/cm$^3$; and
the third composition comprises Ge and one or more p-type impurity dopants at an impurity concentration of at least $7 \times 10^{20}$ atoms/cm$^3$.

16. The IC structure of claim 15, wherein:
the p-type impurity dopants comprise at least one of B or Ga; and
the n-type impurity dopants comprise Si.

17. The IC structure of claim 14, wherein:
the channel material has a first thickness and wherein at least a first portion the p-type and n-type source material, and at least a first portion of the p-type and n-type drain material have a second thickness, greater than the first thickness;
a second portion of the n-type source material that overlaps the second length, and a second portion of the n-type drain material that overlaps the second length, have a third thickness that is less than the second thickness; and
a second portion of the p-type source material that overlaps the third length, and a second portion of the p-type drain material that overlaps the third length, have a third thickness that is less than the second thickness.

* * * * *